United States Patent [19]

Pogue et al.

[11] 4,143,317

[45] Mar. 6, 1979

[54] MULTIPLE RANGE PEAK READING VOLTMETER

[75] Inventors: James L. Pogue, Zion; John M. Kutzler, Waukegan, both of Ill.

[73] Assignee: Outboard Marine Corporation, Waukegan, Ill.

[21] Appl. No.: 726,997

[22] Filed: Sep. 27, 1976

[51] Int. Cl.² .................. G01R 19/04; G01R 19/14; G01R 15/08

[52] U.S. Cl. ................ 324/103 P; 324/115; 324/119; 324/133

[58] Field of Search ............. 324/103 P, 115, 119, 324/133, 110

[56] References Cited

U.S. PATENT DOCUMENTS

| | | | |
|---|---|---|---|
| 2,478,966 | 8/1949 | Gilbert | 324/115 |
| 2,654,860 | 10/1953 | Lewis | 324/103 P |
| 3,201,754 | 8/1965 | Reiner et al. | 324/133 |
| 3,281,692 | 10/1966 | Beroset | 324/133 |
| 3,345,562 | 10/1967 | Rockwell | 324/119 |
| 3,746,984 | 7/1973 | Cerveny | 324/119 |

*Primary Examiner*—Rudolph V. Rolinec
*Assistant Examiner*—Ernest F. Karlsen
*Attorney, Agent, or Firm*—Michael, Best & Friedrich

[57] ABSTRACT

A voltmeter for selectively indicating the polarity and magnitude of a peak value of voltage. The voltmeter comprises an ammeter, a diode bridge including positive and negative terminals and first and second probe terminals, a capacitor connected to the positive and negative terminals, and variable resistance switching means connected in series between one of the positive and negative terminals and the ammeter for selectively coupling the ammeter across the positive and negative terminals. Filter switching means are provided for selectively coupling the probe terminals to a single polarity of the voltage whereby the voltmeter affords charging of the capacitor so that the magnitude of the positive voltage differential between the positive and negative terminals is substantially equal to the magnitude of the peak value of the single polarity of voltage coupled to the probe terminals.

21 Claims, 1 Drawing Figure

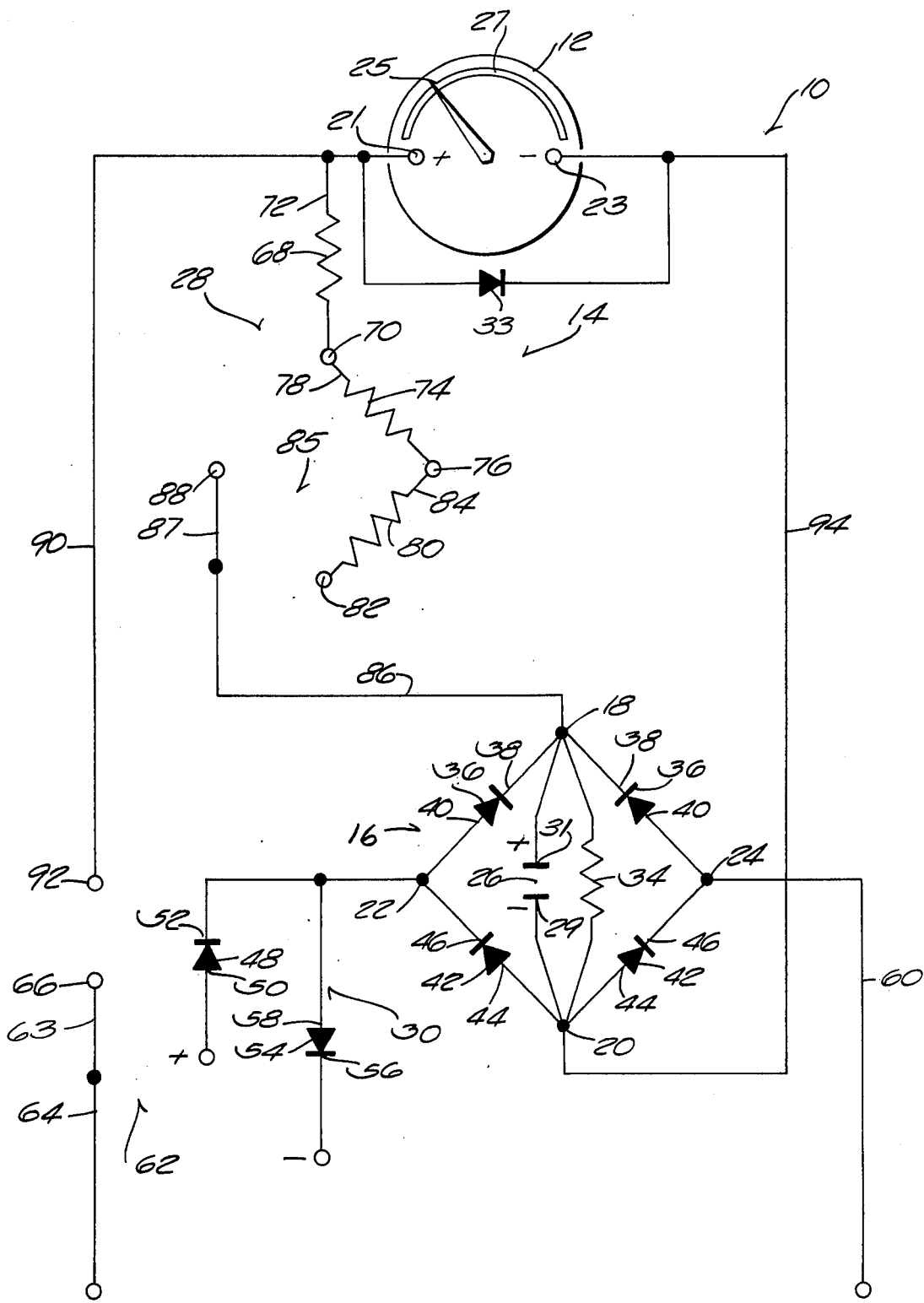

MULTIPLE RANGE PEAK READING VOLTMETER

BACKGROUND OF THE INVENTION

The invention relates generally to circuits affording use of electrical meters to make measurements, and more particularly to circuits affording use of an ammeter to selectively measure different ranges of voltage. Still more particularly, the invention relates to voltmeters for selectively measuring the magnitude of peak voltages.

Attention is directed to the following U.S. Pat. Nos.:
Dyer, 2,845,596, July 29, 1958
Campbel, 3,492,575, Jan. 27, 1970
Bausman, 2,255,502, Sept. 9, 1941
Harriman, 2,924,769, February 9, 1960

Attention is also directed to pages 67-70 of a book entitled ELEMENTS OF ELECTRICAL MEASUREMENTS written by Arthur T. Tiedemann and published in 1967 by Allyn and Bacan, Inc., 150 Tremont Street, Boston, Mass.

SUMMARY OF THE INVENTION

The invention provides a circuit affording use of a meter having two terminals to selectively indicate the polarity and the magnitude of a peak value of a voltage. The circuit comprises a diode bridge including positive and negative terminals and first and second probe terminals, and also comprises a capacitor connected to the positive and negative terminals. Conductor means including a variable resistance switching means connected to and between one of the positive and negative terminals and the meter for selectively coupling one of said meter terminals to the positive terminal and the other of said meter terminals to said negative terminal. The circuit includes conductor means including filter switching means; for selectively coupling the probe terminals to a single polarity of voltage impressed across an electrical element, whereby the circuit affords charging of the capacitor so that the magnitude of the positive voltage differential between the positive and negative terminals is substantially equal to the magnitude of the peak value of the single polarity of voltage coupled to the probe terminals.

The invention also provides a voltmeter for selectively indicating the polarity and the magnitude of the peak value of a voltage impressed across an electrical element. The voltmeter comprises a meter, a positive terminal and a negative terminal, a capacitor connected to the positive terminal and to the negative terminal, and conductor means including variable resistance switching means connected in series between one of the positive and negative terminals and the meter for selectively coupling the meter across the positive and negative terminals. The voltmeter also comprises a first probe terminal and a second probe terminal conductor means including, filter switching means; for selectively coupling the probe terminals to a single polarity of the voltage impressed across the electrical element, and a diode bridge coupled to the probe terminals and to the positive and negative terminals. The diode bridge affords charging of the capacitor so that the magnitude of the positive voltage differential between the positive and negative terminals is substantially equal to the magnitude of the peak value of the single polarity of voltage coupled to the probe terminals.

In accordance with an embodiment of the invention the meter comprises an ammeter.

Also in accordance with an embodiment of the invention there is provided a resistive element coupled in parallel with the capacitor and to the positive and negative terminals to provide a maximum RC time constant, which RC time constant is substantially greater than the period of the voltage coupled to the probe terminals.

Also in accordance with an embodiment of the invention the diode bridge comprises a first pair of diodes each having a cathode coupled to the positive terminal and an annode coupled to a separate one of the probe terminals, and a second pair of diodes each having an annode coupled to the negative terminal and a cathode coupled to a separate one of the probe terminals.

Also in accordance with an embodiment of the invention the variable resistance switching means comprises a first resistor having a first resistance and including one end having a first terminal and an opposite end adapted for connection to the meter, a second resistor having a second resistance greater than said first resistance and including one end having a second terminal and an opposite end coupled to the first terminal, a third resistor having a third resistance greater than said second resistance and including one end having a third terminal and an opposite end coupled to the second terminal, and first switching means affording selective coupling of the positive terminal to one of the first terminal, the second terminal, and the third terminal to afford use of the meter to measure different ranges of peak voltage.

Also in accordance with an embodiment of the invention the filter switching means comprises a first diode having a positive annode terminal and also having a cathode coupled to the first probe terminal, a second diode having a negative cathode terminal and also having an annode coupled to the first probe terminal, a first probe wire, a second probe wire coupled to the second probe terminal, and second switching means affording selective coupling of the first probe wire to one of the positive annode terminal and the negative cathode terminal.

Also in accordance with an embodiment of the invention there is provided a direct couple wire having an end terminal and being adapted for coupling the meter across the end terminal and the negative terminal. The second switching means affords selective coupling of the first probe wire to the direct couple wire end terminal, thereby affording use of the meter to indicate a small current flow through an electrical element.

One of the principal features of the invention is the provision of a circuit affording use of a meter to selectively indicate the polarity and the magnitude of a peak value of a voltage.

Another of the principal features of the invention is the provision of the circuit including a variable resistance switching means which affords use of an ammeter to measure different ranges of peak voltage.

Another of the principal features of the invention is the provision of the circuit including a direct couple wire which affords use of the ammeter to indicate a current flow.

Another of the principal features of the invention is the provision of a circuit affording use of an ammeter to make substantially all the electrical measurements necessary to trouble shoot a capacitor discharge ignition system.

Another of the principal features of the invention is the provision of a voltmeter which selectively indicates the polarity and the magnitude of a peak value of a voltage, which voltmeter can be simply operated to make substantially all the electrical measurements necessary to trouble shoot a capacitor discharge ignition system.

Other features and advantages of the embodiments of the invention will become known by reference to the following general description, the appended claims, and drawings.

DRAWINGS

The single FIGURE is a schematic illustration of a voltmeter embodying various of the features of the invention.

Before explaining the embodiments of the invention in detail, it is to be understood that the invention is not limited in its application to the details of the construction and the arrangement of components set forth in the following description or illustrated in the drawings. The invention is capable of other embodiments and of being practiced and carried out in various ways. Also, it is to be understood that the phraseology and terminology employed herein is for the purpose of description and should not be regarded as limiting.

DESCRIPTION OF THE PREFERRED EMBODIMENT

The FIGURE schematically illustrates a voltmeter 10 which comprises a meter 12 and a circuit 14 affording use of the meter 12 to selectively indicate the polarity and the magnitude of the peak value of a voltage such as exists across the various components or electrical elements contained in a capacitor discharge ignition system. As will be described in more detail below, the circuit 14 includes a first probe wire 64 and a second probe wire 60 which can be connected or coupled across the various components in a capacitor discharge ignition system, and the meter 12 can be calibrated and coupled in series with variable resistance switching means 28 to provide values or readings which correspond to the different ranges of peak voltage existing across such components.

The meter 12 can comprise any conventional electrical meter having an indicating movement (not shown) capable of a response proportional to a current flow therethrough, and preferably comprises an ammeter 12 including a positive input 21 and a negative input 23. The movement of the electrical meter or ammeter 12 is protected against excess voltage by a diode 33 which is coupled across the positive input 21 and the negative input 23. Various ammeters having different types of readouts can be used, including those providing a digital readout. The ammeter 12 preferably comprises a 50 microampere DC ammeter and includes an indicating needle 25 which deflects from left to right along a semicircular scale 27 having a range of graduated markings from zero to fifty. The indicating needle 25 deflects in response to a positive voltage differential being coupled across the positive and negative inputs 21 and 23 respectively.

The circuit 14 has a diode bridge 16 including a positive terminal 18 and a negative terminal 20, and also including a first probe terminal 22 and a second probe terminal 24 respectively adapted for connection to the first probe wire 64 and the second probe wire 60. A capacitor 26 is connected to the positive and negative terminals 18 and 20. More specifically, the capacitor 26 includes an annode 31 coupled to the positive terminal 18 and a cathode 29 coupled to the negative terminal 20.

Conductor means variable resistance switching means 28 connected in series between one of the positive and negative terminals 18 and 20 and the meter 12 is provided for selectively coupling the ammeter 12 across the positive and negative terminals 18 and 20. More particularly, as shown in the figure, when the ammeter 12 is coupled across the positive and negative terminals, the positive input 21 of the ammeter is coupled to the positive terminal 18 by the variable resistance switching means 28, and the negative input 23 of the ammeter is coupled to the negative terminal 20 by a wire 94. Thus, a positive voltage differential impressed across the capacitor 26 and between the positive and negative terminals 18 and 20 causes the indicating needle 25 of the ammeter 12 to be displaced from left to right along the semicircular scale 27 to provide a measurement or reading.

The circuit 14 includes conductor means including filter switching means 30 for selectively coupling the probe terminals 22 and 24 to a single polarity of voltage impressed across an electrical element such as is contained in a capacitor discharge ignition system. When the probe terminals are coupled to such voltage, the circuit 14 affords charging of the capacitor 26 to a voltage having a magnitude equal to the magnitude of the peak value of the voltage coupled to the probe terminals. The voltage differential impressed across the capacitor 26 and coupled to the positive and negative terminals 18 and 20 is positive. As will be described in more detail below, the RC time constant of the capacitor circuit is large enough so that the magnitude of the voltage differential remains substantially equal to the magnitude of the peak value of the voltage for a period of time long enough to afford a reading or measurement of the magnitude of such voltage utilizing the ammeter 12.

The portion of the circuit 14 affording such charging of the capacitor 26 comprises the diode bridge 16. The diode bridge 16 preferably includes a first pair of conventional diodes 36 each having a cathode 38 coupled to the positive terminal 18 and an anode 40 coupled to a separate one of the probe terminals 22 and 24. The diode bridge 16 also includes a second pair of conventional diodes 42 each having an anode 44 coupled to the negative terminal 20 and a cathode 40 coupled to a separate one of the probe terminals 22 and 24.

Utilizing the standard convention of positive current flow, a positive voltage coupled to the probe terminals 22 and 24 will cause current to flow from the probe terminal 22 through the forwardly biased diode 36 to the positive terminal 18, which current will positively charge the anode 27 of the capacitor 26 to the peak value of the positive voltage and will then flow from the negative terminal 20 through the forwardly biased diode 42 to the second probe terminal 24. A negative voltage coupled to the probe terminals 22 and 24 will cause positive current to flow in the opposite direction from the second probe terminal 24 through the forwardly biased diode 36 to the positive terminal 18, which current will positively charge the anode 27 of the capacitor 26 to the peak value of the negative voltage and will then flow from the negative terminal 20 through the forwardly biased diode 42 to the first probe terminal 22.

Thus, the diode bridge 16 is constructed so that regardless of whether a single polarity of positive or negative voltage is coupled to the probe terminals 22 and 24, the current flow will positively charge the anode 27 of the capacitor 26 to the peak value of the voltage so that a positive voltage differential exists across the capacitor, and hence exists between the positive and negative terminals 18 and 20. Since the positive input 21 of the ammeter is connected to the positive terminal 18 and the negative input 23 of the ammeter is connected to the negative terminal 20, the ammeter 12 will always be connected in the circuit so that a reading indicating the magnitude of the peak voltage impressed across the capacitor can be made.

As noted above, the conductor means including filter switching means 30 selectively couples the probe terminals 22 and 24 to a single polarity of voltage impressed across an electrical element. Although various arrangements are possible, as shown schematically in the figure, such filter switching means 30 preferably comprises a first diode 48 having a positive anode terminal 50 and also having a cathode 52 coupled to the first probe terminal 22. The filter switching means 30 also comprises a second diode 54 having a negative cathode terminal 56 and also having an anode 58 coupled to the first probe terminal 22. The conductor means including filter switching means 30 includes the second probe wire 60 coupled to the second probe terminal 24, and second switching means 62 affording selective coupling of the first probe wire 64 to one of the positive anode terminal 50 and the negative cathode terminal 56 for respectively coupling a positive or negative voltage across the probe terminals 22 and 24.

More specifically, when making peak voltage measurements with the voltmeter 10, the first probe wire 64 and the second probe wire 60 are connected or coupled to an electrical element having a voltage impressed across it. The voltage measured can be of any type including AC, DC or pulsating DC, i.e., positive or negative voltage pulses. When the first probe wire 64 is coupled by the second switching means 62 to the positive anode terminal 50, the diode 48 allows positive voltage to be coupled to the first probe terminal 22, but blocks or filters out any negative voltage. Hence, only a single polarity of voltage, i.e., positive voltage is coupled across the probe terminals 22 and 24. Likewise, when the first probe wire 64 is coupled by the second switching means 62 to the negative cathode terminal 56, the second diode 54 allows only negative voltage to be coupled across the probe terminals 22 and 24. If desired, a DC voltage such as is generated by a battery can also be coupled to the probe terminals 22 and 24 when the first probe wire 64 is coupled to the appropriate one of the positive anode terminal 50 and negative cathode terminal 56.

While various arrangements can be utilized, as is shown schematically in the FIGURE, the second switching means 62 preferably comprises a switch 63 coupled to the first probe wire 64, which switch 63 includes a contact 66 which can be selectively positioned in separate conducting engagement with one of the positive anode terminal 50 and the negative cathode terminal 56. The switch 63 preferably comprises a single pole, 3 position rotary switch. By coupling the contact 66 to one of the positive anode terminal 50 and the negative cathode terminal 56, positive or negative voltage, respectively, will be coupled across the probe terminals 22 and 24. Hence, the capacitor 26 will charge to a voltage having a magnitude equal to the magnitude of the peak value of the voltage coupled to the probe terminals, thereby affording use of the ammeter to provide a reading or measurement of the peak value of the single polarity of voltage.

As noted, the variable resistance switching means 28 is coupled in series with the ammeter 12 and is appropriately calibrated so that the ammeter 12 indicates the magnitude of the peak voltage impressed across the capacitor 26. While various arrangements are possible, as is shown schematically in the figure, such variable resistance switching means comprise a first resistor 68 having a first resistance and including one end having a first terminal 70 and an opposite end 72 connected to the positive input 21 of the ammeter 12. A second resistor 74 has a second resistance greater than the first resistance and includes one end having a second terminal 76 and an opposite end 78 coupled to the first terminal 70. A third resistor 80 has a third resistance greater than the second resistance and includes one end having a third terminal 82 and an opposite end 84 coupled to the second terminal 76. The variable resistance switching means 28 includes first switching means 85 for affording selective coupling of the positive terminal 18 to one of the first terminal 70, the second terminal 76, and the third terminal 82 of the resistors for increasing the resistance connected in series with the ammeter and hence increasing the range of the scale readings of the ammeter 12.

More specifically, the ammeter 12 is calibrated in conjunction with the first resistor 68 which preferably has a resistance of one hundred thousand ohms, the second resistor 74 which preferably has a resistance of one million ohms, and the third resistor 80 which preferably has a resistance of ten million ohms so that the zero to fifty scale 27 facilitates readings of voltage ranges from zero to five, zero to fifty, and zero to five hundred volts, respectively.

While various arrangements are possible, the first switching means 85 preferably comprises a switch 87 having a wire 86 coupled to the positive terminal 18 and including a contact 88 which can be selectively positioned in separate conducting engagement with one of the first terminal 70, the second terminal 76, and the third terminal 82, thereby allowing selection of the zero to five, zero to fifty, and zero to five hundred volt ranges during use of the voltmeter 10. The switch 87 preferably comprises a single pole three position rotary switch.

The resistance of the variable resistance switching means 28 connected in series with the ammeter 12, and the capacitance of the capacitor 26 connected in parallel with the variable resistance switching means 28 are selected so that the RC time constant of the circuit is such that the peak voltage impressed across the capacitor 26 remains relatively constant for a period of time long enough so that a reading of the ammeter 12 can be made. While the voltmeter 10 can be utilized for reading DC voltage, it is particularly adapted for reading a single polarity of periodic voltage pulses. The RC time constant of the circuit should be long in comparison to the period of the voltage pulses measured so that the capacitor does not discharge significantly before another voltage pulse again charges the capacitor to the peak voltage of the voltage pulses.

A resistor or resistive element 34 is preferably coupled in parallel with the capacitor 26 and to the positive and negative terminals 18 and 20 to provide a maximum RC time constant for the circuit. The RC time constant is preferably substantially greater than the period of the voltage coupled to the probe terminals, but should allow relatively quick discharge of the capacitor to allow for additional measurements of other voltages after the voltage measured has been disconnected from the probe terminals 60 and 64.

As disclosed in the U.S. Cavil U.S. Pat. No. 3,577,971, issued July 11, 1971, some capacitor discharge ignition systems utilize a trigger voltage which is impressed across the output terminals of a small coil of wire or trigger coil by a rotating magnet structure. The existence of such a trigger voltage, which can be as low as a few tenths a volt, can be qualitatively indicated by placing the ammeter 12 across the output terminals of the trigger coil so that the ammeter indicates a small current flow. More specifically, in order to use the ammeter 12 to indicate the presence of such a small current flow, the circuit 14 further comprises a direct couple wire 90 connected to the positive input 21 of the ammeter 12. The wire 90 includes an end terminal 92 which can be directly coupled to the first probe wire 64 by engagement with the contact 66 of the second switching means 62. As noted earlier, the wire 94 connects the negative input 23 of the ammeter to the negative terminal 20. Thus the direct couple wire 90 affords a direct path from the first probe wire 64 across the ammeter 12 to the negative terminal 20, exclusive of any connection to the variable resistance means 28.

The ammeter 12 will indicate a flow of small positive current since the diode 42 of the diode bridge 16 will couple positive voltage impressed across the ammeter from the negative terminal 20 to the second probe terminal 24 and to the second probe wire 60. Hence, the ammeter 12 can be utilized to indicate the presence of a small current flow through an electrical element, such as the trigger coil, when the trigger coil is coupled across the first and second probe wires 64 and 60. The ammeter 12 will indicate the presence of even a few microamperes of current such as might flow through the trigger coil during low rpm or cranking of an engine. The deflection of the needle 27 of the ammeter 12 thus provides a qualitative indication that a small positive trigger voltage is impressed across the trigger coil and hence that the trigger coil and rotating magnet structure are operating properly.

The voltmeter 10 can be simply operated to make substantially all the electrical measurements necessary to troubleshoot a capacitor discharge ignition system. The various voltages which exist across the components or electrical elements of a capacitor discharge ignition system generally vary in magnitude from 0 to about 500 volts. The voltage can be AC, DC or pulsating DC in nature. The voltmeter 10 can read or measure the peak value of a single polarity of the voltage impressed across an electrical element and coupled to the first and second probe wires 64 and 60.

More specifically, to read the peak value of a positive polarity of the voltage, the switch 63 of the filter switching means 32 is placed in the positive position, i.e., so that the contact 66 is in conducting engagement with positive anode terminal 50. By positioning the contact 88 of the switch 87 of the variable resistance switching means 85 to a position in conducting engagement with one of the resistance terminals 70, 76 and 82, the voltmeter can be used to measure the peak value of positive voltage within the ranges of zero to five, zero to fifty, and zero to five hundred volts.

The voltmeter 10 can similarly be used to measure the peak value of a negative polarity of the voltage by positioning the switch 63 to a negative position, i.e., so that the contact 66 is in conducting engagement with the negative cathode terminal 56 and again utilizing the several voltage ranges of the ammeter 12. As noted above, the ammeter can be used to indicate a small current flow, and hence to qualitatively check the voltage output or operation of the trigger coil and rotating magnet structure. Such measurement can be made by positioning the switch 63 of the filter switching means 30 so that the contact 66 is in conducting engagement with the end terminal 92 of the direct couple wire 90.

Various other features of the invention are set forth in the following claims:

We claim:

1. A circuit for use with an electrical meter having two terminals to selectively indicate the polarity and the magnitude of a peak value of a voltage, said circuit comprising a diode bridge including positive and negative terminals and first and second probe terminals, a capacitor connected across said positive and negative terminals, first conductor means, including variable resistance switching means connected to and between one of said positive and negative terminals and one of said meter terminals, for selectively coupling one of the meter terminals to said positive terminal and the other of said meter terminals to said negative terminal, second conductor means, including filter switching means, having a pair of diodes with an anode of a first of the diodes and a cathode of the second of the diodes connected to one of said first and second probe terminals for selectively coupling said probe terminals to a single polarity of a voltage impressed across an electrical element, whereby said capacitor is charged so that the magnitude of the positive voltage differential between said positive and negative terminals is substantially equal to the magnitude of the peak value of the single polarity of voltage coupled to said probe terminals.

2. A circuit in accordance with claim 1 including a resistive element coupled in parallel with said capacitor and across said positive and negative terminals to provide a maximum RC time constant for said circuit, said maximum RC time constant being substantially greater than the period of the voltage coupled to said probe terminal.

3. A circuit in accordance with claim 1 wherein said diode bridge comprises a first pair of diodes each having a cathode coupled to said positive terminal and an anode coupled to a separate one of said probe terminals, and a second pair of diodes each having an anode coupled to said negative terminal and a cathode coupled to a separate one of said probe terminals.

4. A circuit in accordance with claim 1 wherein said variable resistance switching means comprises a first resistor having a first resistance and including one end having a first terminal and an opposite end adapted for connection to said one of said meter terminals, a second resistor having a second resistance greater than said first resistance and including one end having a second terminal and an opposite end coupled to said first terminal, a third resistor having a third resistance greater than said second resistance and including one end having a third terminal and an opposite end coupled to said second terminal, and first switching means for selectively coupling said positive terminal to one of said first terminal, said second terminal, and said third terminal so that the meter can be used to measure different ranges of peak voltage.

5. A circuit in accordance with claim 4 wherein said first switching means comprises a switch coupled to said positive terminal and including a contact which can be selectively positioned in separate conducting engagement with one of said first terminal, said second terminal, and said third terminal.

6. A circuit in accordance with claim 1 wherein said second conductor means including said filter switching means comprises a first diode having a positive anode terminal and also having a cathode coupled to said first probe terminal, a second diode having a negative cathode terminal and also having an anode coupled to said first probe terminal, a first probe wire, a second probe wire coupled to said second probe terminal, and second switching means for selectively coupling said first probe wire to one of said positive anode terminal and said negative cathode terminal.

7. A circuit in accordance with claim 6 for use with an ammeter having said two terminals constituting a positive input and a negative input, wherein said first conductor means includes a wire connected between the negative ammeter input and said negative terminal, said circuit further comprising a direct couple wire connected to the positive ammeter input and including an end terminal, and wherein said second switching means is adapted for selectively coupling said first probe wire to said end terminal thereby connecting the ammeter directly across the first probe terminal and the negative terminal so that the ammeter can be used to indicate a small current flow through an electrical element.

8. A circuit in accordance with claim 7 wherein said second switching means comprises a switch coupled to said first probe wire and including a contact which can be selectively positioned in separate conducting engagement with one of said end terminal, said positive anode terminal, and said negative cathode terminal.

9. A voltmeter for selectively indicating the polarity and the magnitude of a peak value of a voltage, and also for selectively indicating small current flows, said voltmeter comprising an ammeter having a positive input and a negative input, a diode bridge having positive and negative terminals and first and second probe terminals, said diode bridge including a first pair of diodes each having a cathode coupled to said positive terminal and an anode coupled to a separate one of said probe terminals, said voltmeter also comprising a capacitor connected across said positive terminal and said negative terminal, conductor means including a wire connected between the negative ammeter input and said negative terminal, a first resistor having a first resistance and including one end having a first terminal and an opposite end connected to said positive ammeter input, a second resistor having a second resistance greater than said first resistance and including one end having a second terminal and an opposite end coupled to said first terminal, a third resistor having a third resistance greater than said second resistance and including one end having a third terminal and an opposite end coupled to said second terminal, first switching means for selectively coupling said positive terminal to one of said first terminal, said second terminal, and said third terminal to thereby selectively couple the ammeter across said positive and negative terminals so that the ammeter can be used to measure different ranges of peak voltage, a direct couple wire connected to said positive ammeter input and including an end terminal, a first diode having a positive anode terminal and also having a cathode coupled to said first probe terminal, a second diode having a negative cathode terminal and also having an anode coupled to said first probe terminal, a first probe wire, a second probe wire coupled to said second probe terminal, second switching means for selectively coupling said first probe wire to one of said positive anode terminal and said negative cathode terminal for selectively coupling said probe terminals to a single polarity of voltage impressed across an electrical element and for selectively coupling said first probe wire to said end terminal so that the ammeter can be used to indicate small current flows, a resistive element coupled in parallel with said capacitor and between said positive and negative terminals to provide a maximum RC time constant, said RC time constant being substantially greater than the period of the voltage coupled to said probe terminal, whereby said capacitor is charged so that the magnitude of the positive voltage differential between said positive and negative terminals is substantially equal to the magnitude of the peak value of the single polarity voltage coupled to said probe terminals.

10. A circuit in accordance with claim 9 wherein said first switching means comprises a switch coupled to said positive terminal and including a contact which can be selectively positioned in separate conducting engagement with one of said first terminal, said second and said third terminal, and wherein said second switching means comprises a switch coupled to said first probe wire and including a contact which can be selectively positioned in separate conducting engagement with one of said end terminal, said positive anode terminal, and said negative cathode terminal.

11. A circuit for use with an ammeter having a positive input and a negative input to selectively indicate the polarity and the magnitude of a peak value of a voltage and also to selectively indicate small current flows, said circuit comprising a full wave rectifier bridge including a positive terminal and a negative terminal and a first probe terminal and a second probe terminal, a capacitor connected across said positive terminal and said negative terminal, conductor means including a wire connected between the negative ammeter input and said negative terminal, a first resistor having a first resistance and including one end having a first terminal and an opposite end adapted for connection to the positive ammeter input, a second resistor having a second resistance greater than said first resistance and including one end having a second terminal and an opposite end coupled to said first terminal, a third resistor having a third resistance greater than said second resistance and including one end having a third terminal and an opposite end coupled to said second terminal, and first switching means for selectively coupling said positive terminal to one of said first terminal, said second terminal, and said third terminal to thereby couple the ammeter across said positive and negative terminals so that the ammeter can be used to measure different ranges of peak voltage, a first diode having a positive anode terminal and also having a cathode coupled to said first probe terminal, a second diode having a negative cathode terminal and also having an anode coupled to said first probe terminal, a first probe wire, a second probe wire coupled to said second probe terminal, a direct couple wire connected to the positive ammeter input and including an end terminal, second switching means for selectively coupling said probe terminals to a single polarity of voltage impressed across an electrical element, and for selectively coupling said probe wire to said end terminal so that the ammeter can be used to indicate small current flows, and a resistive element coupled in parallel with said capacitor and across said positive and negative terminals to provide a maximum RC time constant for said circuit, said RC time constant being substantially greater than the period of the voltage coupled to said probe terminals.

12. A circuit in accordance with claim 11 wherein said first switching means comprises a switch coupled to said positive terminal and including a contact which can be selectively positioned in separate conducting engagement with one of said first terminal, said second terminal, and said third terminal, and wherein said second switching means comprises a switch coupled to said first probe wire and including a contact which can be selectively positioned in separate conducting engagement with one of said end terminal, said positive anode terminal, and said negative cathode terminal.

13. A voltmeter in accordance with claim 11 wherein said variable resistance switching means comprises a first resistor having a first resistance and including one end having a first terminal and an opposite end adapted for connection to said one of said terminals, a second resistor having a second resistance greater than said first resistance and including one end having a second terminal and an opposite end coupled to said first terminal, a third resistor having a third resistance greater than said second resistance and including one end having a third terminal and an opposite end coupled to said second terminal, and first switching means for selectively coupling said positive terminal to one of said first terminal, said second terminal, and said third terminal so that the meter can be used to measure different ranges of peak voltage.

14. A voltmeter in accordance with claim 13 wherein said first switching means comprises a switch coupled to said positive terminal and including a contact which can be selectively positioned in separate conducting engagement with one of said first terminal, said second terminal, and said third terminal.

15. A voltmeter for selectively indicating the polarity and the magnitude of a peak value of a voltage impressed across an electrical element, said voltmeter comprising an electrical meter having two terminals, a full wave rectifier diode bridge including a positive terminal and a negative terminal, and a first probe terminal and a second probe terminal, a capacitor connected across said positive terminal and said negative terminal, conductor means, including variable resistance switching means connected to and between one of said positive and negative terminals and one of said meter terminals, for selectively coupling one of the meter terminals to said positive terminal and the other of said meter terminals to said negative terminal, and second conductor means including filter switching means having a pair of diodes with an anode of a first of the diodes and a cathode of the second of the diodes connected to one of said first and second probe terminals for selectively coupling said probe terminals to a single polarity of voltage impressed across an electrical element, whereby said capacitor is charged so that the magnitude of the positive voltage differential between said positive and negative terminals is substantially equal to the magnitude of the peak value of the single polarity of voltage coupled to said probe terminals.

16. A voltmeter in accordance with claim 15 including a resistive element coupled in parallel with said capacitor and across said positive and negative terminals to provide a maximum RC time constant, said RC time constant being substantially greater than the period of the voltage coupled to said maximum probe terminal.

17. A voltmeter in accordance with claim 15 wherein said diode bridge comprises a first pair of diodes each having a cathode coupled to said positive terminal and an anode coupled to a separate one of said probe terminals, and a second pair of diodes each having an anode coupled to said negative terminal and a cathode coupled to a separate one of said probe terminals.

18. A voltmeter in accordance with claim 15 wherein said second conductor means including said filter switching means comprises a first diode having a positive anode terminal and also having a cathode coupled to said first probe terminal, a second diode having a negative cathode terminal and also having an anode coupled to said first probe terminal, a first probe wire, a second probe wire coupled to said second probe terminal, and second switching means for for selectively coupling said first probe wire to one of said positive anode terminal and said negative cathode terminal.

19. A voltmeter in accordance with claim 18 wherein said meter comprises an ammeter and said two terminals constitute having a positive input and a negative input, wherein said conductor means includes a wire connected between the negative ammeter input and said negative terminal, said circuit further comprising a direct couple wire connected to the positive ammeter input and including an end terminal, and wherein said second switching means is adapted for selectively coupling said first probe wire to said end terminal thereby connecting the ammeter directly across the first probe terminal and the negative terminal so that the ammeter can be used to indicate a small current flow through an electrical element.

20. A voltmeter in accordance with claim 19 wherein said second switching means comprises a switch coupled to said first probe wire and including a contact which can be selectively positioned in separate conducting engagement with one of said end terminal, said positive anode terminal, and said negative cathode terminal.

21. A voltmeter in accordance with claim 15 wherein said meter comprises an ammeter.

* * * * *

UNITED STATES PATENT AND TRADEMARK OFFICE
CERTIFICATE OF CORRECTION

PATENT NO. : 4,143,317

DATED : March 6, 1979

INVENTOR(S) : James L. Pogue et al.

It is certified that error appears in the above—identified patent and that said Letters Patent is hereby corrected as shown below:

Column 4, line 47, "40" should read -- 46 --.

Signed and Sealed this

Twenty-second Day of July 1980

[SEAL]

Attest:

SIDNEY A. DIAMOND

Attesting Officer　　Commissioner of Patents and Trademarks